(12) United States Patent
Kim (10) Patent No.: US 7,167,116 B2
(45) Date of Patent: Jan. 23, 2007

(54) MEMORY DEVICES HAVING SINGLE BIT BUS STRUCTURE WITH CURRENT MODE SIGNALING AND METHODS OF OPERATING SAME

(75) Inventor: Chan-kyung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/172,164

(22) Filed: Jun. 30, 2005

(65) Prior Publication Data

US 2006/0028367 A1 Feb. 9, 2006

(30) Foreign Application Priority Data

Aug. 3, 2004 (KR) .................. 10-2004-0061092

(51) Int. Cl.
 *H03M 1/00* (2006.01)
(52) U.S. Cl. .................. 341/110; 341/155; 341/144
(58) Field of Classification Search ............... 341/110, 341/144, 172, 155; 375/232
See application file for complete search history.

(56) References Cited

U.S. PATENT DOCUMENTS

| 5,121,121 | A | * | 6/1992 | Grudkowski et al. | ....... 341/172 |
|---|---|---|---|---|---|
| 5,218,621 | A | * | 6/1993 | Cudak et al. | ............... 375/232 |
| 6,154,157 | A | * | 11/2000 | Wong | .......................... 341/110 |
| 6,320,417 | B1 | * | 11/2001 | Kirsch et al. | ................. 326/86 |
| 6,624,773 | B1 | * | 9/2003 | Wong | .......................... 341/136 |
| 6,727,831 | B1 | * | 4/2004 | Iwata | ........................ 341/126 |

FOREIGN PATENT DOCUMENTS

| JP | 10050060 | 2/1998 |
|---|---|---|
| KR | 1020000048102 | 7/2000 |

* cited by examiner

Primary Examiner—Jean Bruner Jeanglaude
(74) Attorney, Agent, or Firm—Myers Bigel Sibley & Sajovec, PA (57) ABSTRACT

A memory device for storage of digitally formatted data can include a Digital to Analog Converter (DAC) circuit that is configured to convert digitally formatted data received from outside the memory device to analog formatted data. An Analog to Digital Converter (ADC) circuit is coupled to the DAC circuit and is configured to convert the analog formatted data to the digitally formatted data for storage in the memory device. Related methods are also disclosed.

20 Claims, 4 Drawing Sheets

| d1 | d0 | Ibus (Iref = 20μA) | Ibus−IrefX2 | (Ibus−IrefX2)−IrefX1 | IrefX2−Ibus | IrefX1−(IrefX2−Ibus) | Dva40 | Dvb40 | Dva20 | Dvb20 | Dd1 | Dd0 |
|---|---|---|---|---|---|---|---|---|---|---|---|---|
| 0 | 0 | 70μA | 30μA | 10μA | 0 | 20μA | 0 | 1 | 0 | 0 | 0 | 0 |
| 0 | 1 | 50μA | 10μA | 0 | 0 | 20μA | 0 | 1 | 1 | 0 | 0 | 1 |
| 1 | 0 | 30μA | 0 | 0 | 10μA | 10μA | 1 | 0 | 1 | 0 | 1 | 0 |
| 1 | 1 | 10μA | 0 | 0 | 30μA | 0 | 1 | 0 | 1 | 1 | 1 | 1 |

MEMORY DEVICES HAVING SINGLE BIT BUS STRUCTURE WITH CURRENT MODE SIGNALING AND METHODS OF OPERATING SAME

CROSS-REFERENCE TO RELATED APPLICATION

This application claims the priority of Korean Patent Application No. 10-2004-0061092, filed on Aug. 3, 2004, in the Korean Intellectual Property Office, the disclosure of which is incorporated herein in its entirety by reference.

FIELD OF THE INVENTION

The present invention relates to integrated circuits and, more particularly, to memory devices.

BACKGROUND

Figure 1:
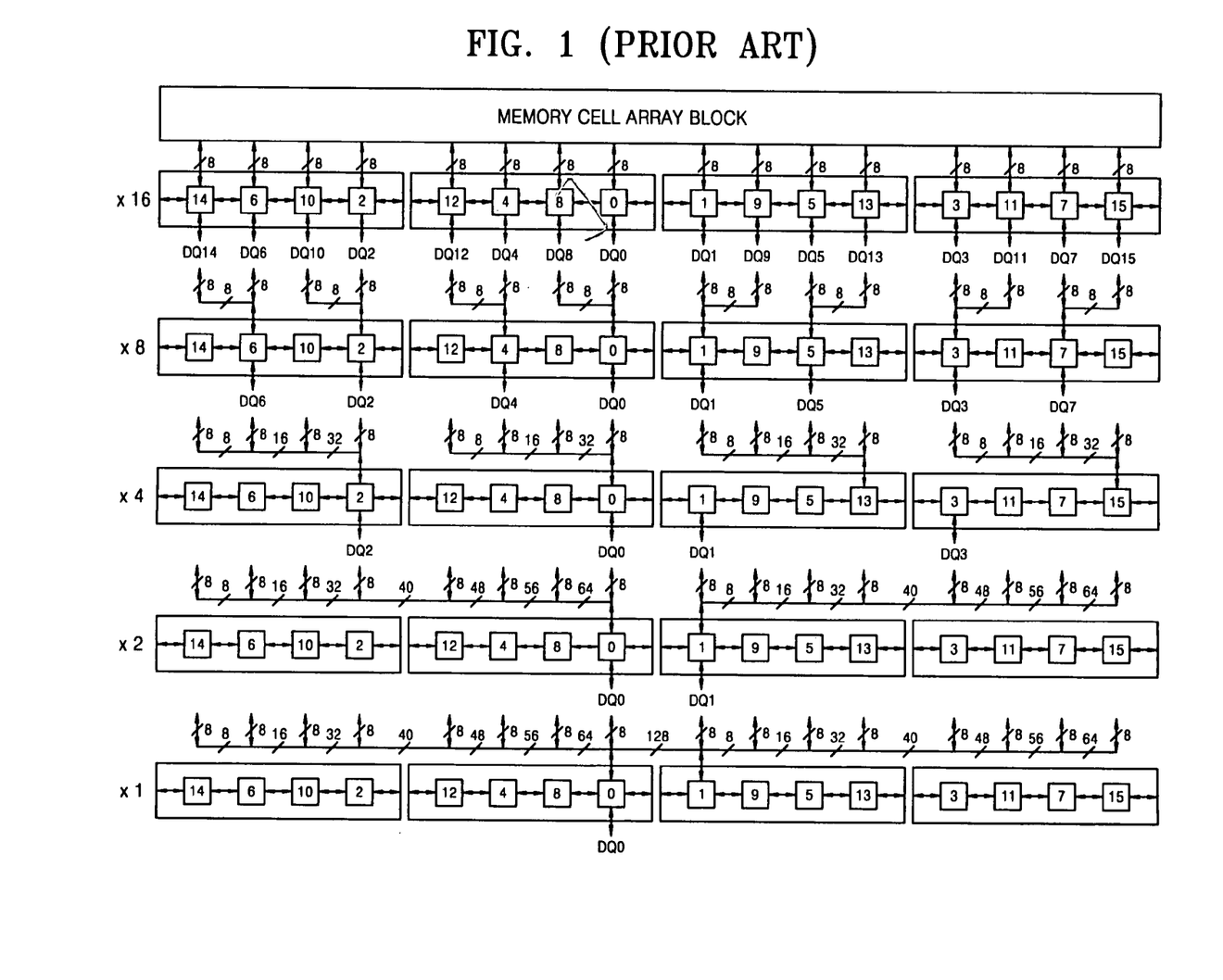
FIG. 1 illustrates a conventional DRAM capable of operating in ×16, ×8, ×4, ×2 and ×1 data input/output modes.

DRAMs use internal bus lines with a large number of bits in order to obtain a high bandwidth. FIG. 1 illustrates a DRAM operating in ×16, ×8, ×4, ×2 and ×1 data input/output modes. If a DRAM having a bandwidth of 1.2 Gbps/s uses a 8-bit bus line per DQ pad, a DRAM having 16 DQ pads uses 16×8=128 internal bus lines.

In the ×16 mode, 8 data lines are coupled between a memory cell array block and 16 IO blocks and each IO block is coupled to 16 DQ pads. For example, memory cell data items transmitted to an IO block 14 through the 8 data lines are output to a DQ 14 pad. In addition, memory cell data items transmitted to an IO block 6 are output to a DQ6 pad, memory cell data items transmitted to an IO block 10 are output to a DQ10 pad, and memory cell data items transmitted to an IO block 2 are output to a DQ2 pad.

In the ×8 mode, 8 internal bus lines are arranged such that the 8 data lines that were coupled to the IO block 14 in the ×16 mode are connected to the IO block 6. In addition, 8 internal bus lines are arranged such that the 8 data lines that were coupled to the IO block 10 are connected to the IO block 2.

In the ×4 mode, 8, 16 and 32 internal bus lines are arranged such that the 8 data lines that were coupled to each of the IO blocks 14, 6, 10 and 2 in the ×16 mode are connected to the IO block 2. In the ×2 mode, 8, 16, 32, 40, 48, 56, 64 internal bus lines are arranged such that the 8 data lines that were coupled to each of IO blocks 14, 6, 10, 2, 12, 4, 8 and 0 in the ×16 mode are connected to the IO block 0. In the ×1 mode, maximum 128 internal bus lines are arranged such that the 8 data lines that were coupled to each of IO blocks 14, 6, 10, 2, 12, 4, 8, 0, 1, 9, 5, 13, 3, 11, 7 and 15 in the ×16 mode are connected to the IO block 0.

To support these various data input/output modes, a large number of data lines may be routed in a memory device. A plurality of data lines may be used if the data lines are operated in a voltage-driven mode. The plurality of data lines may represent overhead that occupies a considerably large part of the chip area of the memory device.

SUMMARY

Embodiments according to the invention can provide memory devices having single bit bus structure with current mode signaling and methods of operating such devices. Pursuant to these embodiments, a memory device for storage of digitally formatted data can include a Digital to Analog Converter (DAC) circuit that is configured to convert digitally formatted data received from outside the memory device to analog formatted data. An Analog to Digital Converter (ADC) circuit is coupled to the DAC circuit and is configured to convert the analog formatted data to the digitally formatted data for storage in the memory device.

In some embodiments according to the invention, the analog formatted data is a single analog formatted signal configured to represent the digitally formatted data received from outside the memory device. In some embodiments according to the invention, the device further includes a single data line coupling the analog formatted data from the DAC circuit to the ADC circuit.

In some embodiments according to the invention, the DAC circuit is further configured to-transmit the digitally formatted data in the analog format to the ADC circuit in current signal format via the single data line. In some embodiments according to the invention, the DAC circuit is a first DAC circuit and a second DAC circuit is configured to convert second digitally formatted data received from outside the memory device to second analog formatted data. A switch is configured to couple an output of the second DAC circuit to the single bit data line when the device operates in a first data input/output mode and to de-couple the output of the second DAC circuit from the single bit data line when the device operates in a second data input/output mode.

In some embodiments according to the invention, the switch is a first switch and a third DAC circuit configured to convert third digitally formatted data received from outside the memory device to third analog formatted data. A second switch is configured to couple an output of the third DAC circuit to the single bit data line when the device operates in a second data input/output mode and to de-couple the output of the second DAC circuit from the single bit data line when the device operates in the first data input/output mode.

In some embodiments according to the invention, the device further includes a fourth DAC circuit that is configured to convert fourth digitally formatted data received from outside the memory device to fourth analog formatted data. A third switch is configured to couple an output of the fourth DAC circuit to the single bit data line when the device operates in the second data input/output mode and to de-couple the output of the third DAC circuit from the single bit data line when the device operates in the first data input/output mode. In some embodiments according to the invention, the first data input/output mode is ×16 mode and the second data input/output mode is ×4 mode.

In some embodiments according to the invention, a method of providing data to/from a memory device includes converting digitally formatted data received from outside the memory device to analog formatted data. The analog formatted data is transmitted to an Analog to Digital Converter (ADC) circuit via a single data line. The analog formatted data is converted to the digitally formatted data and the digitally formatted data is stored in a memory cell array in the memory device.

In some embodiments according to the invention, the analog formatted data is a single analog formatted signal configured to represent the digitally formatted data received from outside the memory device. In some embodiments according to the invention, the memory device is configured to operate in a plurality of operating modes comprising ×16 mode, ×8 mode, and ×4 mode.

DESCRIPTION OF EMBODIMENTS ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
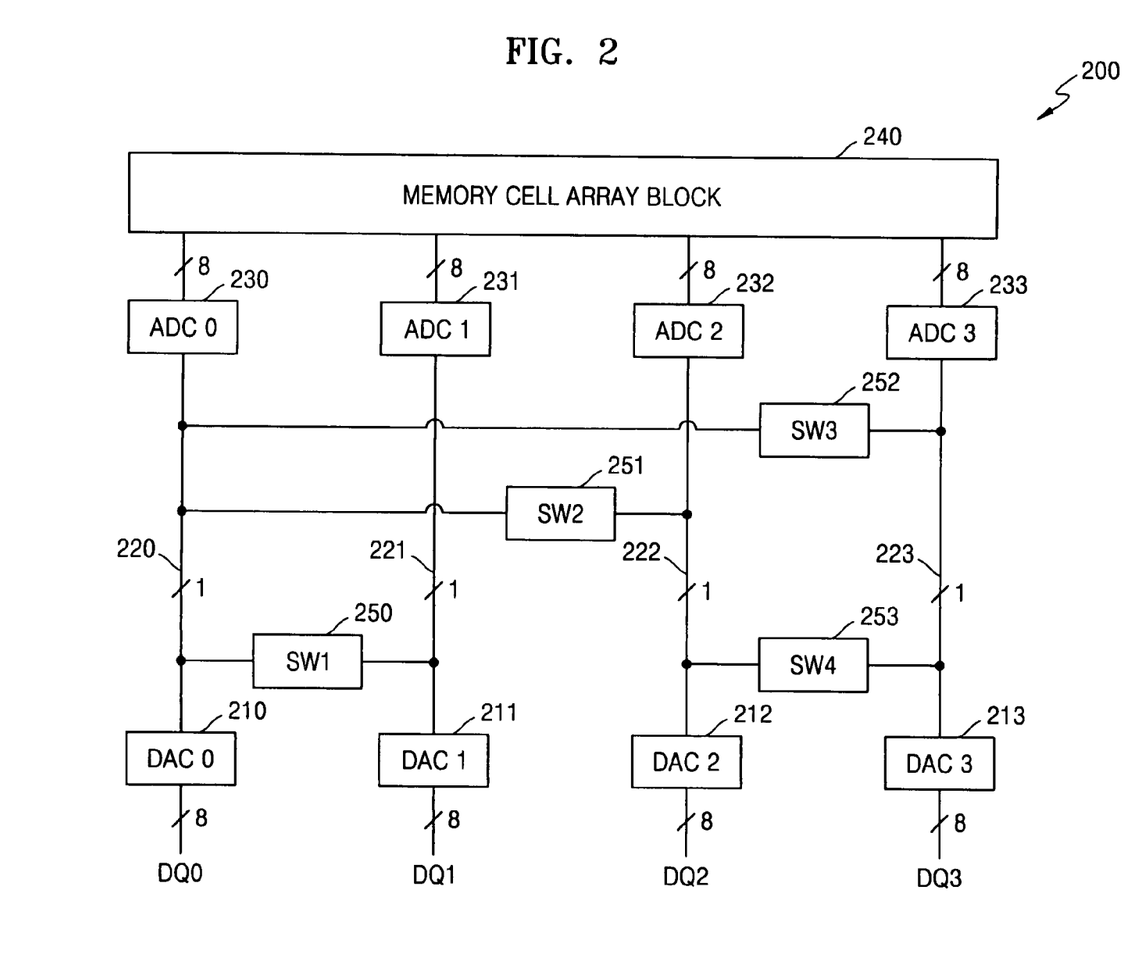
FIG. 2 illustrates a memory device having a single bit bus structure with current mode signaling according to some embodiments of the present invention.

FIG. 2 illustrates a memory device 200 having a single bit bus structure with current mode signaling according to an embodiment of the present invention. Referring to FIG. 2, the memory device 200 includes a plurality of DQ blocks, for example, 4 DQ blocks DQ0, DQ1, DQ2 and DQ3. The 4 DQ blocks DQ0, DQ1, DQ2 and DQ3 can be repeated four times to be extended to 16 DQ blocks in order to match with the data input/output modes of FIG. 1.

The DQ blocks DQ0, DQ1, DQ2 and DQ3 are respectively coupled to Digital to Analog Converter circuits (DACs) 210, 211, 212 and 213. The DQ blocks DQ0, DQ1, DQ2 and DQ3 process serial data items corresponding to a burst length (BL), sequentially input to DQ pads, in parallel. Here, the burst length equals 8.

The DACs 210, 211, 212 and 213 convert data items with BL=8 into analog signals. The analog signals output from the DACs 210, 211, 212 and 213 are transmitted to analog-digital converters (ADCs) 230, 231, 232 and 233 through first, second, third and fourth data lines 220, 221, 222 and 223, respectively. The ADCs 230, 231, 232, 233 convert the analog signals into 8-bit digital signals and transmit the 8-bit digital signals to a memory cell array block 240.

A first switch 250 is coupled between the first and second data lines 220 and 221, and a second switch 251 is coupled between the first and third data lines 220 and 222. A third switch 252 is coupled between the first and fourth data lines 220 and 223, and a fourth switch 253 is coupled between the third and fourth data lines 222 and 223. The first, second, third and fourth switches 250, 251, 252 and 253 are selectively turned on to meet a data input/output mode.

In some embodiments according to the invention, where the 4 DQ blocks DQ0, DQ1, DQ2 and DQ3 are repeated four times to be extended to 16 DQ blocks, the memory device 200 is set to the ×16 mode when the first, second, third and fourth switches 250, 251, 252, 253 are all turned off. The memory device 200 is set to the ×8 mode when the first and fourth switches 250 and 253 are turned on and set to the ×4 mode when the first, second and third switch 250, 251 and 252 are turned on.

In some embodiments according to the invention, various data input/output modes can be supported using a single data line. Compared to the conventional DRAM of FIG. 1, which has 8, 16 and 32 internal data lines in the ×4 mode, the memory device of the present invention has a considerably reduced chip area for data line routing. Current mode signaling on a single data line 220 is explained by the operation of transmitting the analog signals converted by the DACs 210, 211, 212 and 213 to the ADCs 230, 231, 232 and 233.

Figure 3:
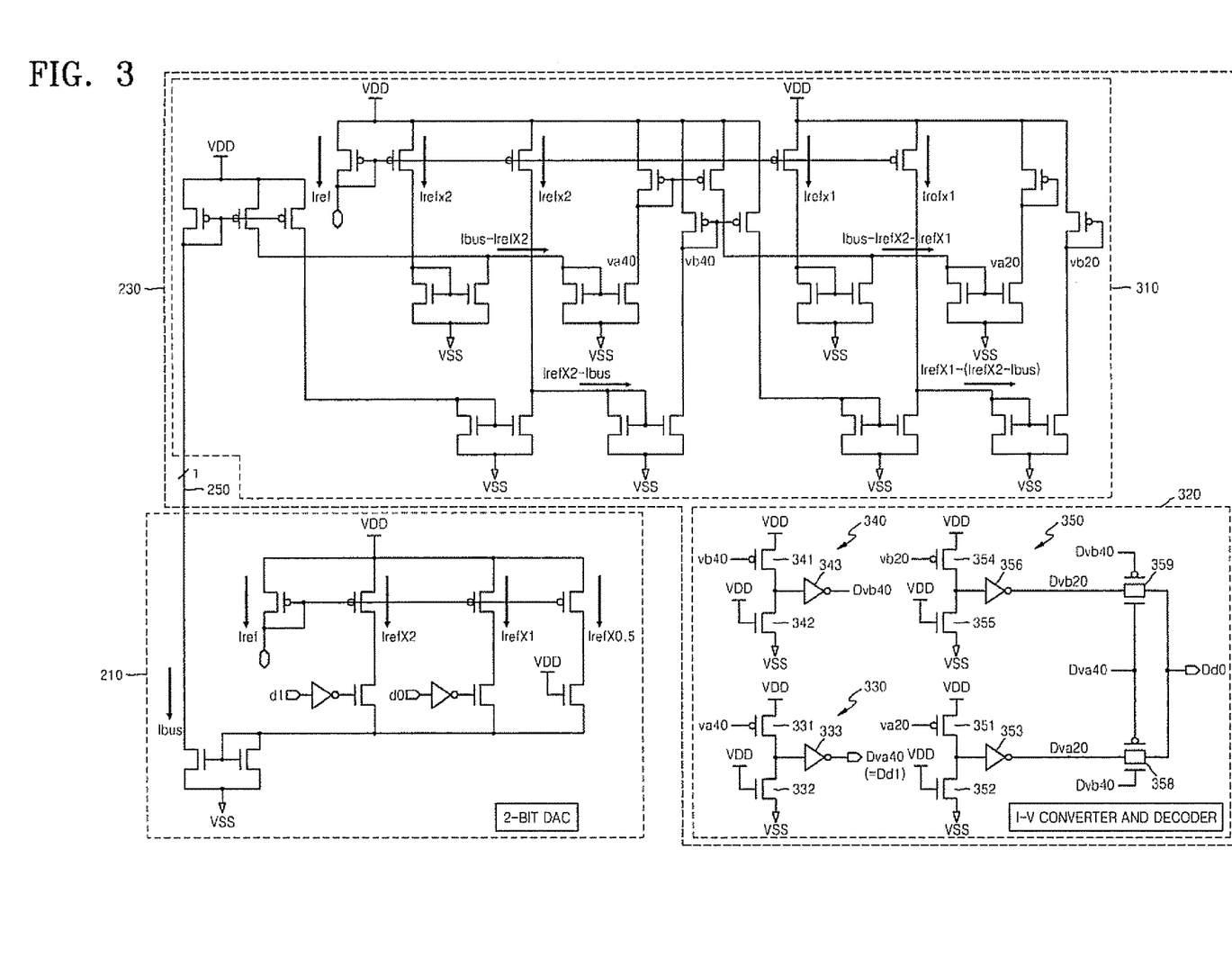
FIG. 3 explains current mode signaling on data lines in cooperation of the operation of the digital-analog converter DAC and the operation of the analog-digital converter ADC of FIG. 2.

Current mode signaling of the first data line 220 in cooperation with the operations of the first DAC 210 and the first ADC 230 coupled to the first data line 220 will now be explained. This is illustrated in FIG. 3 in detail. Though FIG. 3 shows a case where BL is 2, the current mode signaling can be applied to various BLs including BL=4 and 8.

Referring to FIG. 3, the first DAC 210 receives two serial data items d0 and d1 corresponding to BL=2, input through a DQ block DQ0, and converts it into a first analog signal. The first analog signal is represented as a current Ibus flowing through a first data line 220 in response to the data items d1 and d0. The first DAC 210 includes a reference current (Iref) driver, a Iref×2 diver, a Iref×1 driver, a Iref×0.5 driver, and a sum current (Ibus) driver. If the reference current Iref is 20 μA, the current Ibus is 70 μA when the data d1d0 is 00, 50 μA when d1d0 is 01, 50 μA when d1d0 is 10, and 10 μA when d1d0 is 11.

The sum current Ibus on the first data line 220 is delivered to the first ADC 230 to generate 2-bit digital signals Dd1 and Dd0. The first ADC 230 is divided into a current driving unit 310 and a current-voltage conversion and decoding unit 320. The current driving unit 310 includes a first current (Ibus-Iref×2) driver, a second current (Iref×2-Ibus) diver, a third current (Ibus-Iref×2-Iref) diver, and a fourth current (Iref× 1-Iref×2-Ibus) driver. The current diver circuits are constructed of current mirrors.

The outputs of the first current (Ibus-Iref×2) driver and the second current (Iref×2-Ibus) driver generate first and second control signals va40 and vb40. The outputs of the third current (Ibus-Iref×2-Iref) driver and the fourth current (Iref× 2-Ibus-Iref) driver generate third and fourth control signals va20 and vb20. The first, second, third and fourth control signals va40, vb40, va20 and vb20 are provided to the current-voltage conversion and decoding unit 320 to generate digital signals Dd1 and Dd0.

The current-voltage conversion circuits and decoding unit (circuits) 320 includes first and second current-voltage converters 330 and 340 and a decoder 350. The first and second current-voltage converters 330 and 340 receive the first and second control signals va40 and vb40 to generate a fifth control signal Dvb40 and the second digital signal Dd1 that is the most significant bit (MSB), respectively. The decoder 350 generates the first digital signal Dd0 that is the least significant bit (LSB) in response to the third, fourth and fifth control signals va20, vb20 and Dvb40.

The first current-voltage converter 330 includes a first PMOS transistor 331 having a source connected to a power supply voltage Vdd and a gate connected to the output of the first current (Ibus-Iref×2) driver, a first NMOS transistor 332 having a drain connected to the drain of the first PMOS transistor 331, a gate connected to the power supply voltage Vdd and a source connected to a ground voltage Vss, and a first inverter 333 connected to the drains of the first PMOS transistor 331 and the first NMOS transistor 332 to generate the digital signal Dd1.

The second current-voltage converter 340 includes a second PMOS transistor 341 having a source connected to the power supply voltage Vdd and a gate connected to the output of the second current (Iref×2-Ibus) driver, a second NMOS transistor 342 having a drain connected to the drain of the second PMOS transistor 341, a gate connected to the power supply voltage Vdd and a source connected to the ground voltage Vss, and a second inverter 343 connected to the drains of the second PMOS transistor 341 and the second NMOS transistor 342 to generate the fifth control signal Dvb40.

The decoder 350 includes a third PMOS transistor 351 having a source connected to the power supply voltage Vdd and a gate connected to the output of the third current (Ibus-Iref×2-Iref) driver, a third NMOS transistor 352 having a drain connected to the drain of the third PMOS transistor 351, a gate connected to the power supply voltage Vdd and a source connected to the ground voltage Vss and a fourth inverter 356 that is coupled to the drains of the fourth PMOS transistor 354 and the fourth NMOS transistor 355. The decoder 350 further includes a fourth PMOS transistor 354 having a source connected to the power supply voltage Vdd and a gate connected to the output of the fourth current (Iref×2-Ibus-Iref) driver, a fourth NMOS transistor 355 having a drain connected to the drain of the fourth PMOS transistor 354, a gate connected to the power supply voltage Vdd and a source connected to the ground voltage Vss, and serially connected fourth and fifth inverters 356 and 357 that are coupled to the drains of the fourth PMOS transistor 354 and the fourth NMOS transistor 355. The decoder 350 further includes a first transmission gate 358 that outputs the output of the third inverter 353 as the digital signal Dd0 in response to the control signal Dvb40 and the digital signal Dd1, and a second transmission gate 359 that outputs the output of the fourth inverter 356 as the digital signal Dd0 in response to the control signal Dvb40 and the digital signal Dd1.

Figure 4:
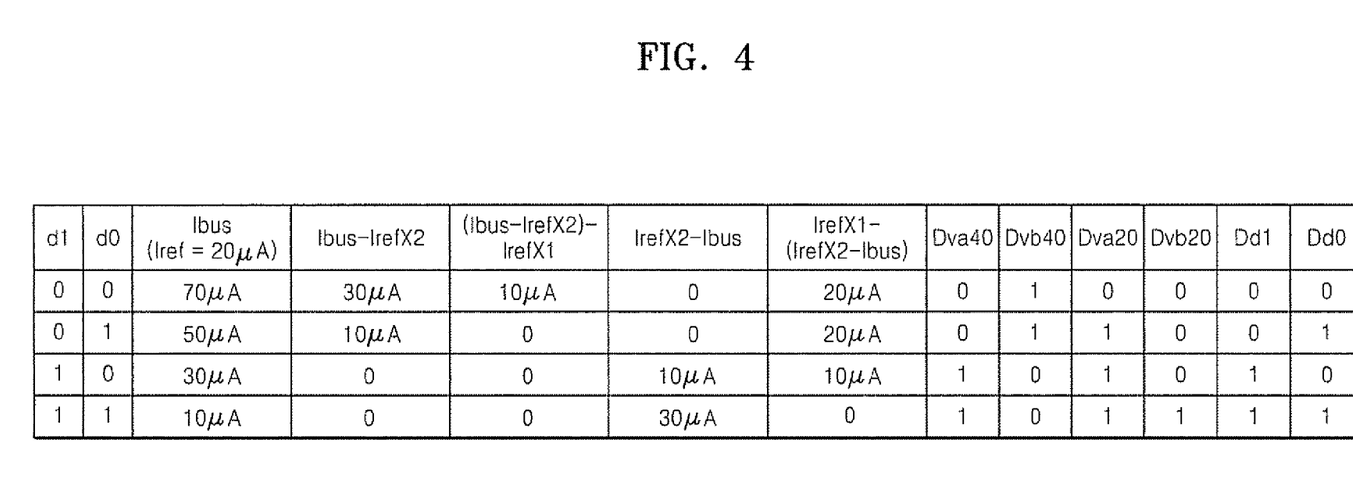
FIG. 4 is a table representing the operations of the digital-analog converter DAC and the analog-digital converter ADC of FIG. 2.

FIG. 4 shows a table representing exemplary operations of the first DAC 210 and the first ADC 230. It will be understood that the values shown in the table of FIG. 4 are only examples and that other values may be used to provide other embodiments according to the invention. Referring to FIG. 4, it can be seen that the data items with BL=2 d1 and d0 input to the DQ0 block are reproduced as the digital signals Dd1 and Dd0 according to the first DAC 210 and the first ADC 230. It is assumed that the reference current Iref is 20 μA.

When d1d0 is 00, the current Ibus output from the first DAC 210 becomes 70 μA, the first current Ibus-Iref×2 of the first ADC 230 reaches 30 μA, the third current Ibus-Iref×2-Iref reaches 10 μA, the second current Iref×2-Ibus hardly flows, and the fourth current Iref×2-Ibus-Iref reaches 20 μA. In addition, the first control signal va40 corresponding to the output of the first current (Ibus-Iref×2) driver becomes a logic "0", the second control signal vb40 corresponding to the output of the second current (Iref×2-Ibus) driver becomes a logic "1", the third control signal va20 that is the output of the third current (Ibus-Iref×2-Iref) driver becomes a logic "0", and the fourth control signal vb20 that is the output of the fourth current (Iref×2-Ibus-Iref driver becomes a logic "0" Accordingly, the digital signals Dd1 and Dd0 are generated as 0 and 0, respectively.

When d1d0 is 01, the current Ibus output from the first DAC 210 becomes 50 μA, the first current Ibus-Iref×2 of the first ADC 230 reaches 10 μA, the third current Ibus-Iref×2-Iref hardly flows, the second current Iref×2-Ibus becomes hardly flows, and the fourth current Iref×2-Ibus-Iref reaches 20 μA. In addition, the first control signal va40 corresponding to the output of the first current (Ibus-Iref×2) driver becomes a logic "0", the second control signal vb40 corresponding to the output of the second current (Iref×2-Ibus) driver becomes a logic "1" the third control signal va20 that is the output of the third current (Ibus-Iref×2-Iref) driver becomes a logic 1"", and the fourth control signal vb20 that is the output of the fourth current (Iref×2-Ibus-Iref) driver becomes a logic "0". Accordingly, the digital signals Dd1 and Dd0 are generated as 0 and 1, respectively.

When d1d0 is 10, the current Ibus output from the first DAC 210 becomes 30 μA, the first current Ibus-Iref×2 of the first ADC 230 hardly flows, the third current Ibus-Iref×2-Iref hardly flows, the second current Iref×2-Ibus reaches 10 μA, and the fourth current Iref×2-Ibus-Iref reaches 10 μA. In addition, the first control signal va40 corresponding to the output of the first current (Ibus-Iref×2) diver becomes a logic "1", the second control signal vb40 corresponding to the output of the second current (Iref×2-Ibus) driver becomes a logic "0", the third control signal va20 that is the output of the third current (Ibus-Iref×2-Iref) driver becomes a logic "1", and the fourth control signal vb20 that is the output of the fourth current (Iref×2-Ibus-Iref) driver becomes a logic "0". Accordingly, the digital signals Dd1 and Dd0 are generated as 1 and 0, respectively.

When d1d0 is 11, the current Ibus output from the first DAC 210 becomes 10 μA, the first current Ibus-Iref×2 of the first ADC 230 hardly flows, the third current Ibus-Iref×2-Lref hardly flows, the second current Iref×2-Ibus reaches 30 μA, and the fourth current Iref×2-Ibus-Iref hardly fioxvs. In addition, the first control signal va40 corresponding to the output of the first current (Ibus-Iref×2) driver becomes a logic "1", the second control signal vb40 corresponding to the output of the second current (Iref×2-Ibus) driver becomes a logic "0", the third control signal va20 that is the output of the third current (Ibus-Iref×2-Iref) driver becomes a logic "1", and the fourth control signal vb20 that is the output of the fourth current (Iref×2-Ibus-Iref) driver becomes a logic "1". Accordingly, the digital signals Dd1 and Dd0 are generated as 1 and 1, respectively.

As described above, a memory device for storage of digitally formatted data can include a Digital to Analog Converter (DAC) circuit that is configured to convert digitally formatted data received from outside the memory device to analog formatted data. An Analog to Digital Converter (ADC) circuit is coupled to the DAC circuit and is configured to convert the analog formatted data to the digitally formatted data for storage in the memory device.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed:

1. A memory device for storage of digitally formatted data comprising:
   a Digital to Analog Converter (DAC) circuit configured to convert digitally formatted data received from outside the memory device to analog formatted data; and
   an Analog to Digital Converter (ADC) circuit, coupled to the DAC circuit, the ADC circuit being configured to convert the analog formatted data to the digitally formatted data for storage in the memory device.

2. A memory device according to claim 1 wherein the analog formatted data comprises a single analog formatted signal configured to represent the digitally formatted data received from outside the memory device.

3. A memory device according to claim 1 further comprising:
   a single data line coupling the analog formatted data from the DAC circuit to the ADC circuit.

4. A memory device according to claim 3 wherein the DAC circuit is further configured to transmit the digitally formatted data in the analog format to the ADC circuit in current signal format via the single data line.

5. A memory device for storage of digitally formatted data comprising:
   a Digital to Analog Converter (DAC) circuit configured to convert digitally formatted data received from outside the memory device to analog formatted data; and
   an Analog to Digital Converter (ADC) circuit, coupled to the DAC circuit, the ADC circuit being configured to convert the analog formatted data to the digitally formatted data for storage in the memory device;
   a single data line coupling the analog formatted data from the DAC circuit to the ADC circuit;
   a second DAC circuit configured to convert second digitally formatted data received from outside the memory device to second analog formatted data; and
   a switch configured to couple an output of the second DAC circuit to the single bit data line when the device operates in a second data input/output mode and to de-couple the output of the second DAC circuit from the single bit data line when the device operates in a first data input/output mode.

6. A memory device according to claim 5 wherein the switch comprises a first switch, the device further comprising:
   a third DAC circuit configured to convert third digitally formatted data received from outside the memory device to third analog formatted data; and
   a second switch configured to couple an output of the third DAC circuit to the single bit data line when the device operates in the second data input/output mode and to de-couple the output of the second DAC circuit from the single bit data line when the device operates in the first data input/output mode.

7. A memory device according to claim 6 the device further comprising:
   a fourth DAC circuit configured to convert fourth digitally formatted data received from outside the memory device to fourth analog formatted data; and
   a third switch configured to couple an output of the fourth DAC circuit to the single bit data line when the device operates in the second data input/output mode and to de-couple the output of the third DAC circuit from the single bit data line when the device operates in the first data input/output mode.

8. A memory device according to claim 7 wherein the first data input/output mode comprises ×16 mode and the second data input/output mode comprises ×4 mode.

9. A memory device comprising:
   a plurality of data input/output blocks configured to process parallel data input sequentially to data input/output blocks;
   Digital to Analog converter (DAC) circuits configured to convert the parallel data provided by the data input/output blocks to respective analog current signals;
   data lines connected to the digital-analog converters to conduct the analog signals, respectively;
   Analog to Digital Converter (ADC) circuits respectively connected to the data lines, the ADC circuits configured to converting the analog current signals to digital voltage signals; and
   switches connected between adjacent data lines and selectively activated in response to a data input/output mode of the memory device.

10. A memory device according to claim 9 wherein the DAC circuits include current mirrors that have different current driving capacity based on binary weights respectively corresponding to the data lines, and output the analog current signals based on the currents provided by the current mirrors that flow responsive to the data conducted on the data lines.

11. A memory device according to claim 9 wherein the ADC circuits include predetermined current driver circuits configured to output control signals in response to currents provided by subtracting predetermined currents of in current driver circuits from the analog current signals.

12. A memory device comprising:
   first, second, third and fourth data input/output blocks configured to process parallel data input sequentially to first, second, third and fourth data input/output pads;
   Digital to Analog Converter (DAC) circuits configured to convert the parallel data provided by the first, second, third and fourth data input/output blocks to analog signals to provide first, second, third and fourth analog signals;

first, second, third and fourth data lines connected to the DAC circuits to conduct the first, second, third and fourth analog signals;

Analog to Digital Converter (ADC) circuits respectively connected to the data lines, the ADC circuits being configured to convert the analog signals to respective digital signals; and first through fourth switches including a first switch coupled between the first and second data lines, a second switch coupled between the first and third data lines, a third switch coupled between the first and fourth data lines and a fourth switch coupled between the third and fourth data lines.

13. A memory device according to claim 12 wherein the first switch is configured to de-couple the second data line from the first data line in a first data input/output mode and to couple the second data line to the first data line in a second data input/output mode;

wherein the second switch is configured to de-couple the third data line from the first data line in the first input/output mode and to couple the third data line to the first data line in a third input/output mode;

wherein the third switch is configured to de-couple the fourth data line from the first data line in the first input/output mode and to couple the fourth data line to the first data line in the third input/output mode; and wherein the fourth switch is configured to de-couple the fourth data line from the third data line in the first input/output mode and to couple the fourth data line to the third data line in a second input/output mode.

14. A memory device according to claim 12 wherein the DAC circuits comprises:

a first reference current driver circuit for providing a predetermined reference current;

a second reference current driver circuit for providing a current corresponding to twice the reference current in response to data input to the corresponding data input/output pad;

a third reference current driver circuit for providing the reference current in response to the data input to the data input/output pad;

a fourth reference current driver circuit for providing a current corresponding to a half of the reference current; and a sum current driver circuit for transmitting an analog current signal corresponding to the sum of the currents provided by the second, third and fourth reference current driver circuits to the corresponding data line.

15. A memory device according to claim 12 wherein the ADC circuits comprise:

a first current driver circuit for providing a current obtained by subtracting the current corresponding to twice the reference current from the analog current signal transmitted to the data line;

a second current driver circuit for providing a current obtained by subtracting the analog current signal from the current corresponding twice the reference current;

a third current driver circuit for providing a current obtained by subtracting the reference current from the current of the first current driver circuit;

a fourth current driver circuit for providing a current obtained by subtracting the reference current from the current of the second current driver circuit;

a current-voltage converter circuit for generating a control signal and the MSB of the corresponding digital signal in response to the outputs of the first and second current diver circuits; and a decoder circuit for generating the LSB of the digital signal in response to the outputs of the third and fourth current driver circuits and the control signal.

16. A memory device according to claim 12 wherein the current-voltage converter comprises:

a first PMOS transistor including a source coupled to a power supply voltage and a gate coupled to the output of the first current driver circuit;

a first NMOS transistor including a drain coupled to the drain of the first PMOS transistor, a gate coupled to the power supply voltage, and a source coupled to a ground voltage;

a first inverter connected to the drains of the first PMOS transistor and the first NMOS transistor to generate the Most Significant Bit (MSB) of the digital signal;

a second PMOS transistor including a source coupled to the power supply voltage and a gate coupled to the output of the second current diver circuit;

a second NMOS transistor including a drain coupled to the drain of the second PMOS transistor, a gate coupled to the power supply voltage, and a source coupled to the ground voltage; and a second inverter connected to the drains of the second PMOS transistor and the second NMOS transistor to generate the control signal.

17. A memory device according to claim 12 wherein the decoder comprises:

a third PMOS transistor whose source coupled to the power supply voltage and whose gate coupled to the output of the third current driver circuit;

a third NMOS transistor whose drain coupled to the drain of the third PMOS transistor, whose gate coupled to the power supply voltage, and whose source coupled to the ground voltage; and a third inverter connected to the drains of the third PMOS transistor and the third NMOS transistor;

a fourth PMOS transistor whose source coupled to the power supply voltage and whose gate coupled to the output of the fourth current driver circuit;

a fourth NMOS transistor whose drain coupled to the drain of the fourth PMOS transistor, whose gate coupled to the power supply voltage, and whose source coupled to the ground voltage; and a fourth inverter connected to the drains of the fourth PMOS transistor and the fourth NMOS transistor;

a first transfer gate for outputting the output of the third inverter as the LSB of the digital signal in response to the control signal and the MSB of the digital signal; and a second transfer gate for outputting the output of the fourth inverter as the LSB of the digital signal in response to the control signal and the MSB of the digital signal.

18. A method of providing data to/from a memory device comprising:

converting digitally formatted data received from outside the memory device to analog formatted data;

transmitting the analog formatted data to Analog to Digital Converter (ADC) circuit via a single data line;

converting the analog formatted data to the digitally formatted data; and storing the digitally formatted data in a memory cell array in the memory device.

19. A method according to claim 18 wherein the analog formatted data comprises a single analog formatted signal configured to represent the digitally formatted data received from outside the memory device.

20. A method according to claim 17 wherein the memory device is configured to operate in a plurality of operating modes comprising ×16 mode, ×8 mode, and ×4 mode.

* * * * *

UNITED STATES PATENT AND TRADEMARK OFFICE
CERTIFICATE OF CORRECTION

PATENT NO. : 7,167,116 B2  Page 1 of 1
APPLICATION NO. : 11/172164
DATED : January 23, 2007
INVENTOR(S) : Kim It is certified that error appears in the above-identified patent and that said Letters Patent is hereby corrected as shown below:

Column 6,

Line 49: "logic 1"", " should read --logic "1",--

Line 59: "diver" should read --driver--

Column 7,

Line 4: "Lref hardly flows," should read --Iref hardly flows,--

Line 5: "hardly fioxvs." should read --hardly flows.--

Column 9,

Line 64: "diver circuits;" should read --driver circuits;--

Column 10,

Line 15: "diver circuit;" should read --diver circuit;--

Signed and Sealed this

Seventeenth Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 7,167,116 B2 Page 1 of 1
APPLICATION NO. : 11/172164
DATED : January 23, 2007
INVENTOR(S) : Kim It is certified that error appears in the above-identified patent and that said Letters Patent is hereby corrected as shown below:

Column 10,

Line 15: "diver circuit;" should read --driver circuit;--

Signed and Sealed this

Seventh Day of August, 2007

JON W. DUDAS
*Director of the United States Patent and Trademark Office*